(12) United States Patent
Kwon et al.

(10) Patent No.: US 11,024,556 B2
(45) Date of Patent: Jun. 1, 2021

(54) SEMICONDUCTOR PACKAGE

(71) Applicant: SAMSUNG ELECTRO-MECHANICS CO., LTD., Suwon-si (KR)

(72) Inventors: Sang Hyun Kwon, Suwon-si (KR); Hyung Kyu Kim, Suwon-si (KR); Seong Chan Park, Suwon-si (KR); Hye Lee Kim, Suwon-si (KR); Choon Keun Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/589,652

(22) Filed: Oct. 1, 2019

(65) Prior Publication Data
US 2021/0005532 A1     Jan. 7, 2021

(30) Foreign Application Priority Data

Jul. 1, 2019    (KR) .................... 10-2019-0078715

(51) Int. Cl.
*H01L 23/42*     (2006.01)
*H01L 23/31*     (2006.01)
*H01L 23/373*    (2006.01)
*H01L 23/00*     (2006.01)
*C09J 133/10*    (2006.01)
*H01L 23/498*    (2006.01)

(52) U.S. Cl.
CPC ............ *H01L 23/42* (2013.01); *C09J 133/10* (2013.01); *H01L 23/3128* (2013.01); *H01L 23/373* (2013.01); *H01L 23/49822* (2013.01); *H01L 24/29* (2013.01); *H01L 2224/2919* (2013.01)

(58) Field of Classification Search
CPC ... H01L 23/42; H01L 23/3128; H01L 23/373; H01L 23/49822; H01L 24/29; H01L 2224/2919; C09J 33/10
See application file for complete search history.

(56) References Cited

U.S. PATENT DOCUMENTS 6,359,341 B1 *  3/2002  Huang ................ H01L 23/13
                                                257/700
9,978,731 B1 *  5/2018  Kim .................... H01L 23/66
(Continued)

FOREIGN PATENT DOCUMENTS

KR         10-0607372 B1    8/2006
KR      10-2017-0069916 A   6/2017

*Primary Examiner* — Mohammed Shamsuzzaman
(74) *Attorney, Agent, or Firm* — Morgan, Lewis & Bockius LLP

(57) ABSTRACT

A semiconductor package includes a semiconductor chip having an active surface on which a connection pad is disposed and an inactive surface opposing the active surface; a heat dissipation member disposed on the inactive surface of the semiconductor chip and including a graphite material; an adhesive member disposed between the semiconductor chip and the heat dissipation member; an encapsulant covering at least a portion of each of the semiconductor chip and the heat dissipation member; and an interconnect structure disposed on the active surface of the semiconductor chip and including a redistribution layer electrically connected to the connection pad. The encapsulant covers at least a portion of aside surface of the adhesive member.

18 Claims, 12 Drawing Sheets

(56) References Cited

U.S. PATENT DOCUMENTS

| | | | |
|---|---|---|---|
| 10,283,487 B2* | 5/2019 | England | H01L 23/367 |
| 10,867,929 B2* | 12/2020 | Yu | H01L 21/78 |
| 2008/0277777 A1* | 11/2008 | Liao | H01L 23/4334 |
| | | | 257/712 |
| 2012/0280382 A1* | 11/2012 | Im | H01L 23/427 |
| | | | 257/712 |
| 2016/0159037 A1* | 6/2016 | Sakaguchi | B32B 7/02 |
| | | | 361/719 |
| 2016/0329261 A1* | 11/2016 | Hung | H01L 23/433 |
| 2016/0336290 A1* | 11/2016 | Kim | C09J 133/068 |
| 2017/0156201 A1* | 6/2017 | Nakayama | H05K 7/20509 |
| 2017/0170095 A1 | 6/2017 | Matsubara | |
| 2018/0175011 A1* | 6/2018 | Sung | H01L 23/5381 |
| 2018/0269127 A1 | 9/2018 | Hung et al. | |
| 2019/0103387 A1* | 4/2019 | Tsou | H01L 21/486 |
| 2019/0123082 A1* | 4/2019 | Lee | H01L 24/19 |
| 2019/0139853 A1* | 5/2019 | Oh | H01L 24/20 |
| 2019/0273030 A1* | 9/2019 | Lim | H01L 23/49838 |
| 2019/0371699 A1* | 12/2019 | Yu | H01L 23/5389 |
| 2020/0083137 A1* | 3/2020 | Park | H01L 23/5226 |
| 2020/0123423 A1* | 4/2020 | Son | C09J 7/385 |
| 2020/0203279 A1* | 6/2020 | Ha | H01L 24/13 |
| 2020/0219786 A1* | 7/2020 | Hung | H01L 23/10 |
| 2020/0273718 A1* | 8/2020 | Cheng | H01L 24/25 |
| 2020/0273811 A1* | 8/2020 | Mallik | H01L 23/53228 |
| 2020/0343231 A1* | 10/2020 | Chang Chien | H01L 21/4817 |
| 2020/0365486 A1* | 11/2020 | Huang | H01L 21/4857 |

* cited by examiner

SEMICONDUCTOR PACKAGE

CROSS-REFERENCE TO RELATED APPLICATION(S)

This application claims benefit of priority to Korean Patent Application No. 10-2019-0078715 filed on Jul. 1, 2019 in the Korean Intellectual Property Office, the disclosure of which is incorporated herein by reference in its entirety.

TECHNICAL FIELD

The present disclosure relates to a semiconductor package.

BACKGROUND

Generally, in a semiconductor chip, numerous fine electrical circuits are integrated. However, it may be difficult to use the semiconductor chip as a final semiconductor product, and it is likely that the semiconductor chip may be damaged due to external physical or chemical impacts. Thus, a semiconductor chip may be packaged and used in electronic devices, and the like, in a packaged state, rather than being used as is.

Recently, a semiconductor chip has been designed to have a reduced thickness, and a semiconductor package may also be required to have a reduced size and thickness.

Also, as a semiconductor package has been designed to have high integration density, a semiconductor chip may be required to have a structure and a material through which heat produced from a semiconductor chip may be rapidly dissipated.

SUMMARY

An aspect of the present disclosure is to provide a semiconductor package which may have a reduced thickness and may improve heat dissipation properties of a semiconductor chip.

According to an aspect of the present disclosure, a semiconductor package includes a semiconductor chip having an active surface on which a connection pad is disposed and an inactive surface opposing the active surface; a heat dissipation member disposed on the inactive surface of the semiconductor chip and including a graphite material; an adhesive member disposed between the semiconductor chip and the heat dissipation member; an encapsulant covering at least a portion of each of the semiconductor chip and the heat dissipation member; and an interconnect structure disposed on the active surface of the semiconductor chip and including a redistribution layer electrically connected to the connection pad.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
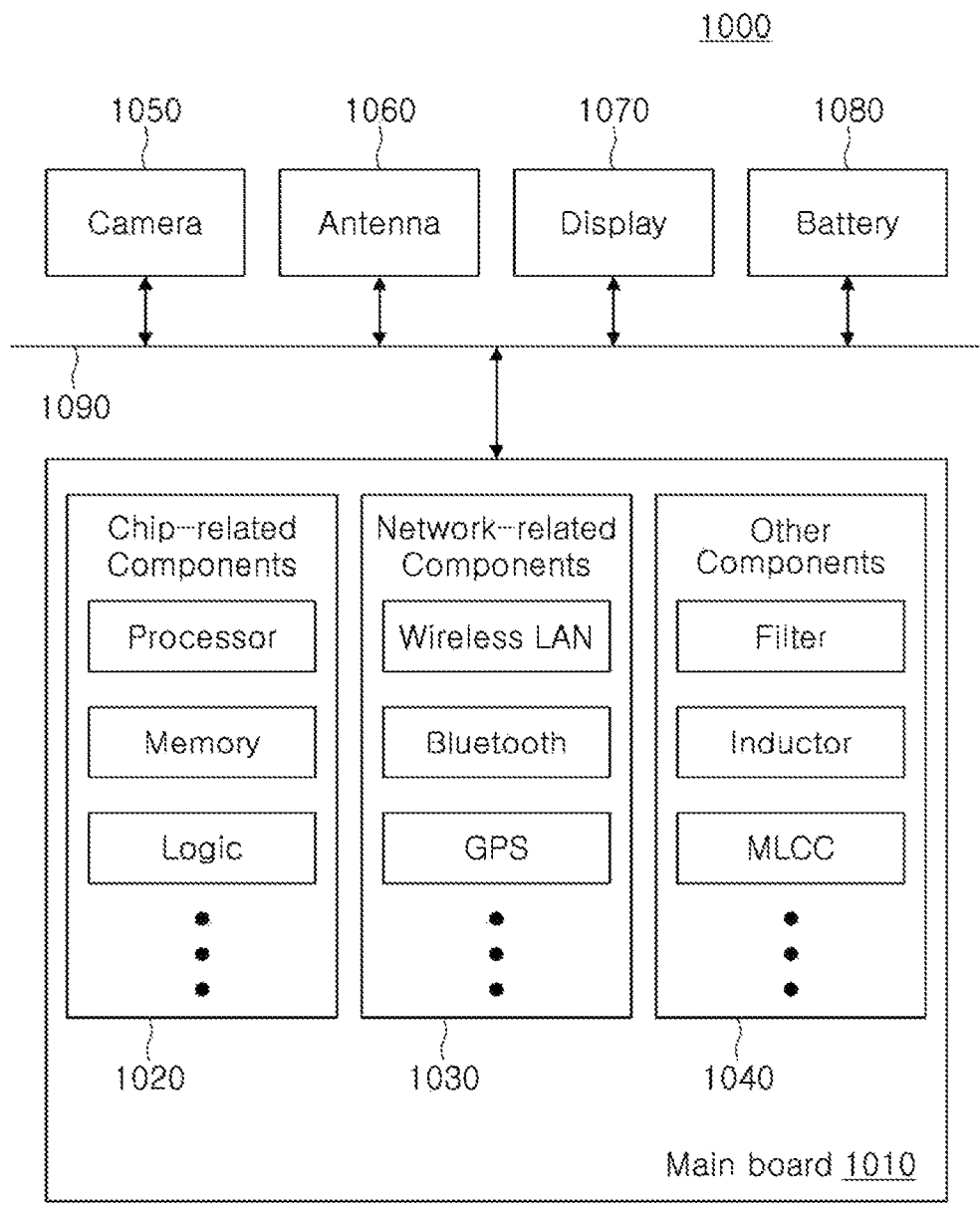
FIG. 1 is a schematic block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
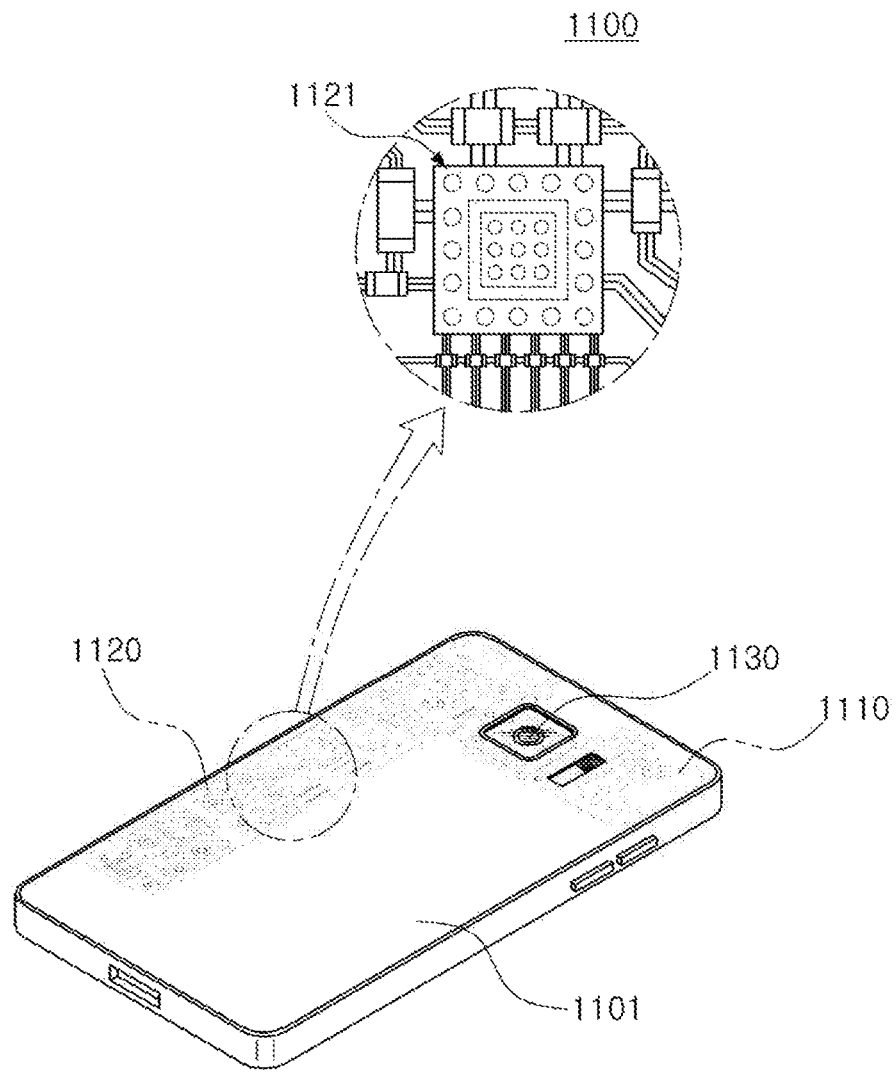
FIG. 2 is a schematic perspective diagram illustrating an example of an electronic device.

FIG. 2 is a schematic perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically and/or electrically connected to the motherboard 1110. In addition, other components that may or may not be physically and/or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described in greater detail with reference to the drawings.

Fan-in Semiconductor Package

Figure 3A:
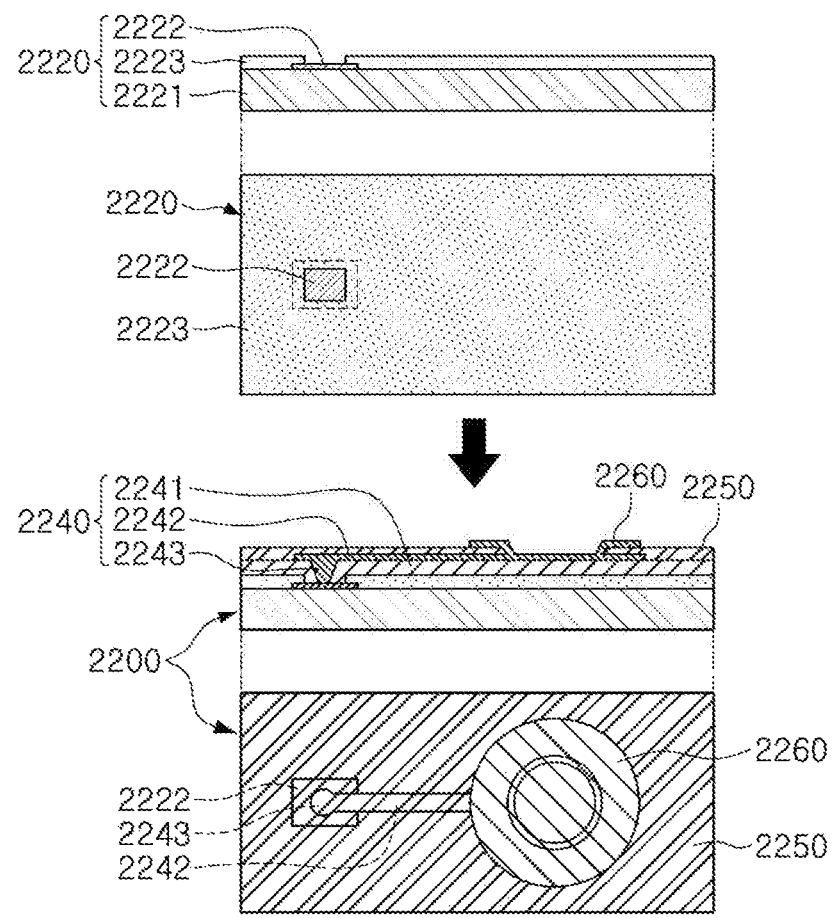
FIGS. 3A and 3B are schematic cross-sectional diagrams illustrating states of a fan-in semiconductor package before and after a packaging process.
Figure 3B:
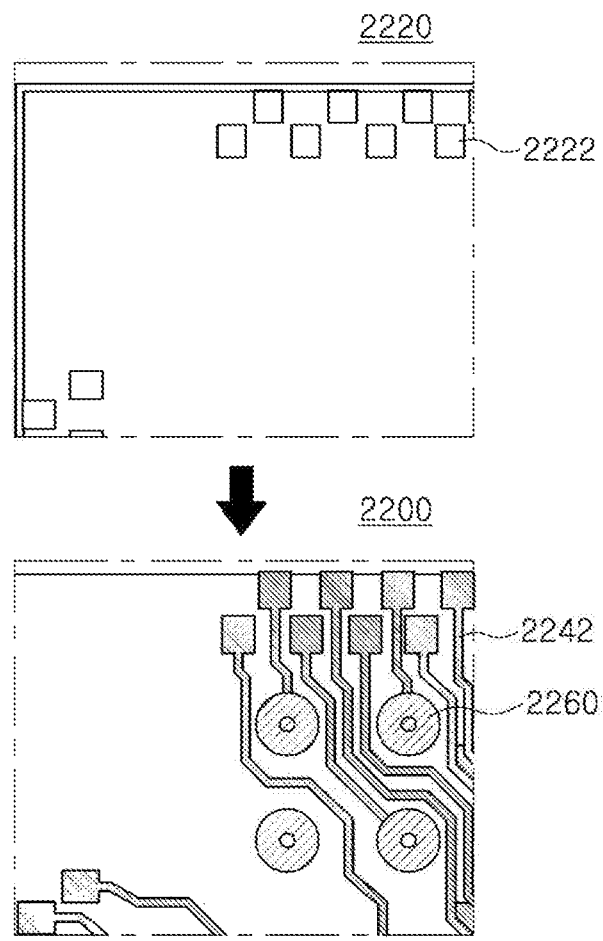

FIGS. 3A and 3B are schematic cross-sectional diagrams illustrating states of a fan-in semiconductor package before and after a packaging process.

Figure 4:
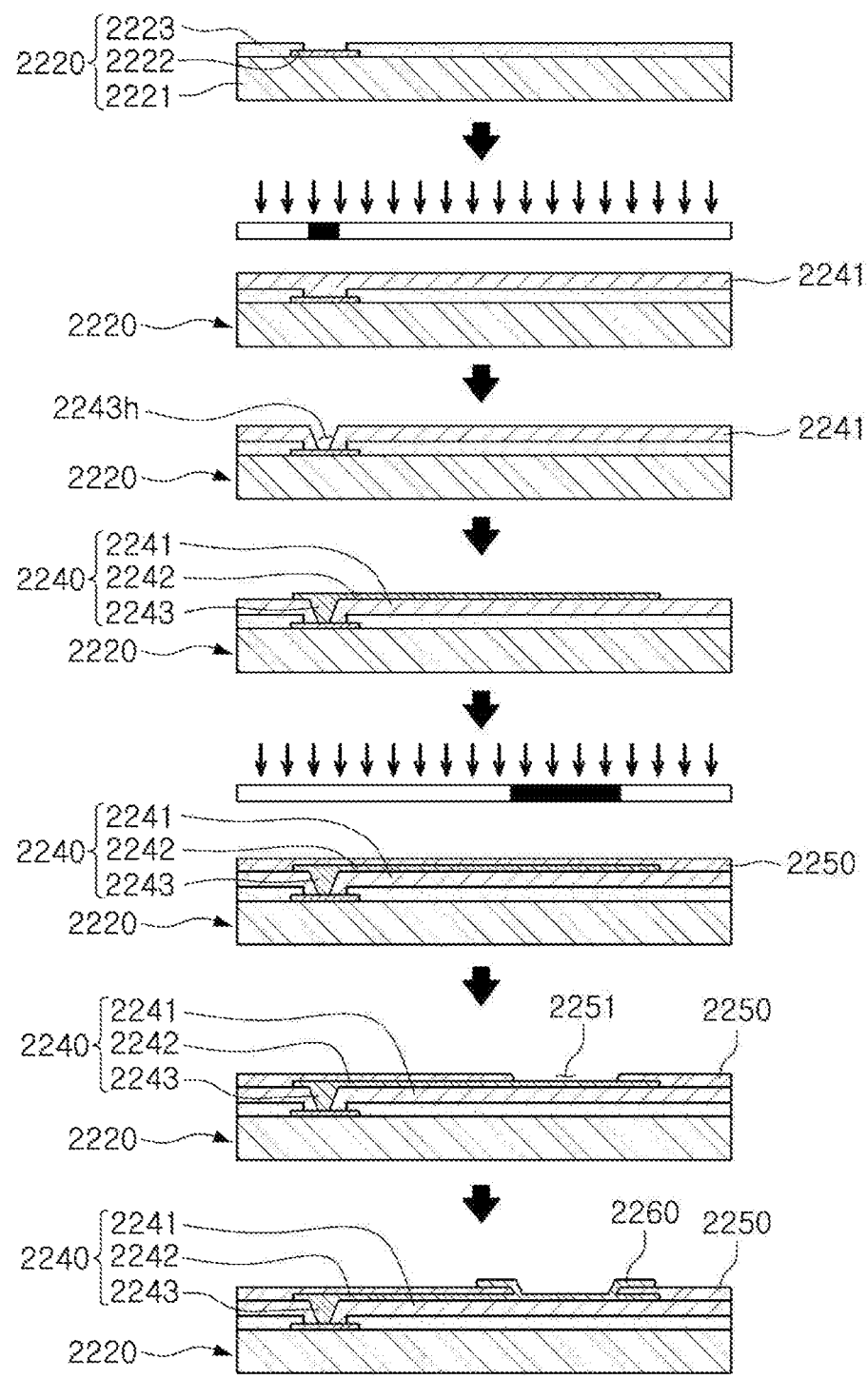
FIG. 4 is a schematic cross-sectional diagram illustrating a process of packaging a fan-in semiconductor package.

FIG. 4 is a schematic cross-sectional diagram illustrating a process of packaging a fan-in semiconductor package.

Referring to the diagrams, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
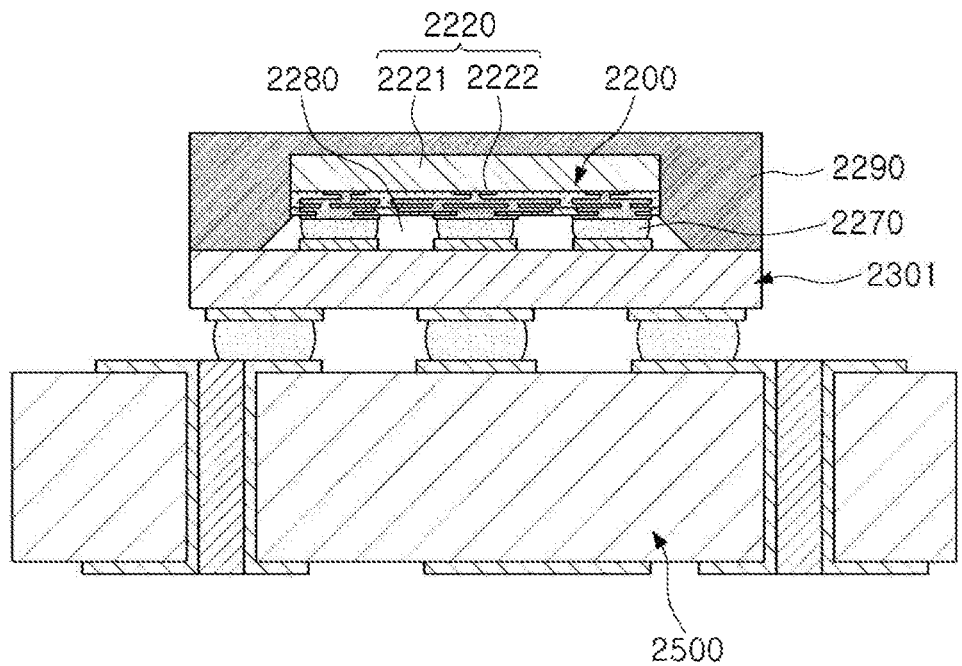
FIG. 5 is a schematic cross-sectional diagram illustrating an example in which a fan-in semiconductor package is mounted on an interposer substrate and mounted on a mainboard of an electronic device.

FIG. 5 is a schematic cross-sectional diagram illustrating an example in which a fan-in semiconductor package is mounted on a printed circuit board and mounted on a mainboard of an electronic device.

Figure 6:
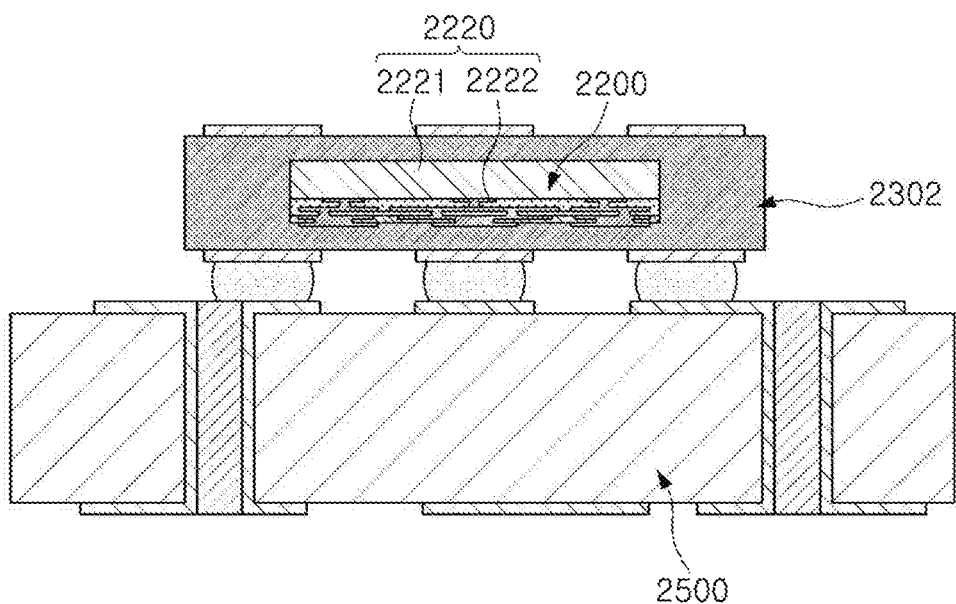
FIG. 6 is a schematic cross-sectional diagram illustrating an example in which a fan-in semiconductor package is embedded in an interposer substrate and mounted on a mainboard of an electronic device.

FIG. 6 is a schematic cross-sectional diagram illustrating an example in which a fan-in semiconductor package is embedded in a printed circuit board and mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and may be then mounted on the mainboard of the electronic device through a packaging process or may be mounted and used on the mainboard of the electronic device in a state in which it is embedded in the BGA substrate.

Fan-Out Semiconductor Package

Figure 7:
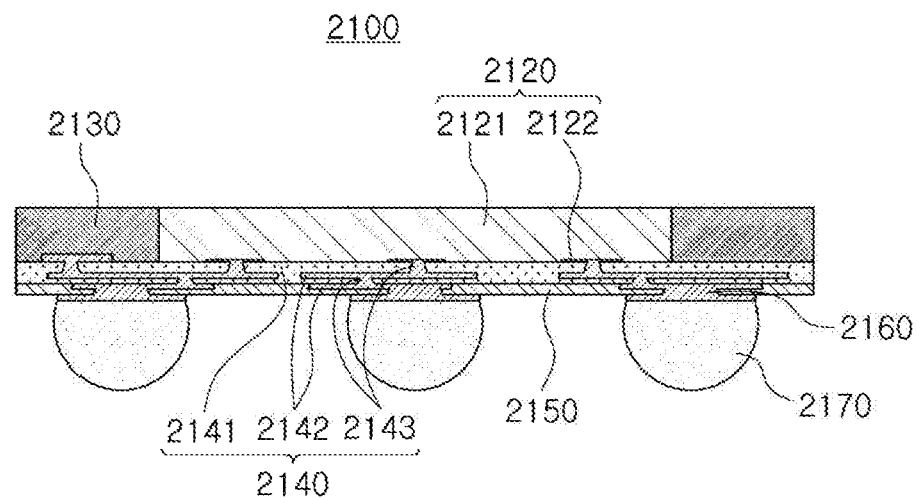
FIG. 7 is a schematic cross-sectional diagram illustrating a fan-out semiconductor package.

FIG. 7 is a schematic cross-sectional diagram illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
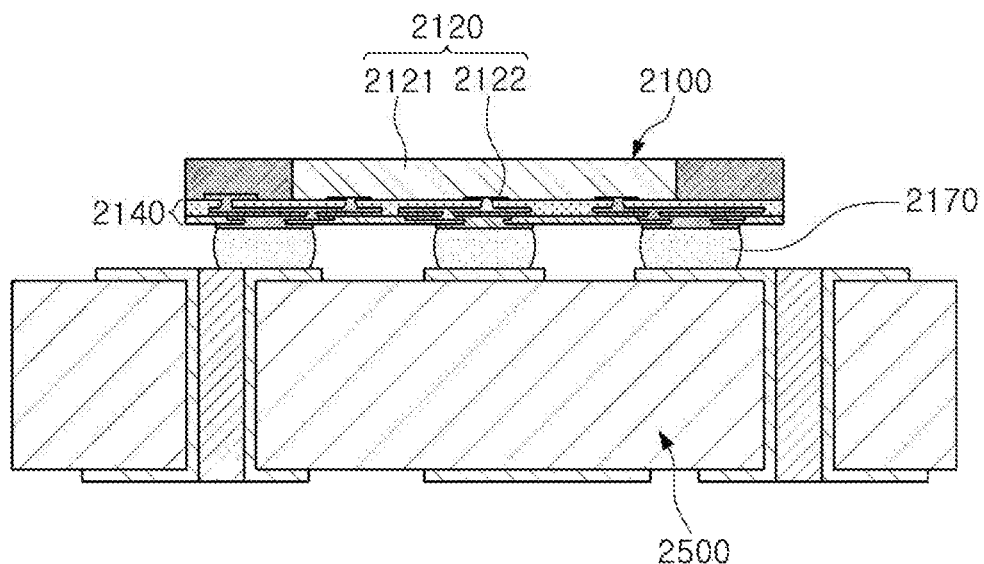
FIG. 8 is a schematic cross-sectional diagram illustrating an example in which a fan-out semiconductor package is mounted on a mainboard of an electronic device.

FIG. 8 is a schematic cross-sectional diagram illustrating an example in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Figure 9:
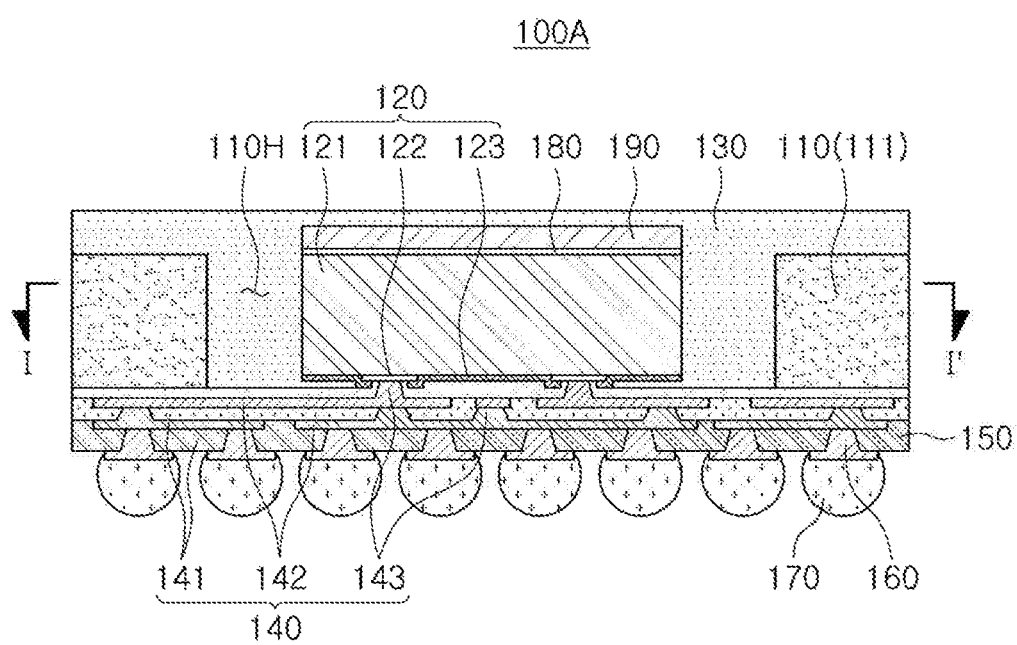
FIG. 9 is a schematic cross-sectional diagram illustrating an example of a semiconductor package.

FIG. 9 is a schematic cross-sectional diagram illustrating an example of a semiconductor package.

Figure 10:
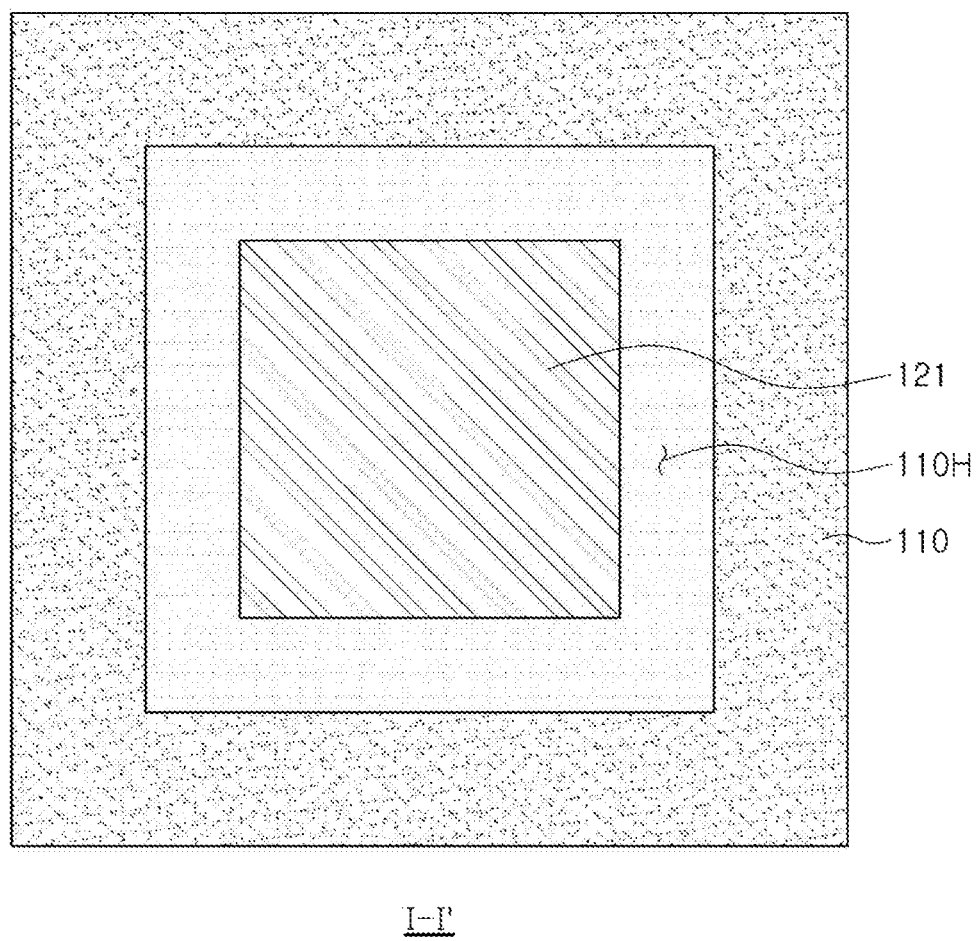
FIG. 10 is a schematic cross-sectional diagram taken along line I-I' in FIG. 9.

FIG. 10 is a schematic cross-sectional diagram taken along line I-I' in FIG. 9.

Figure 11A:
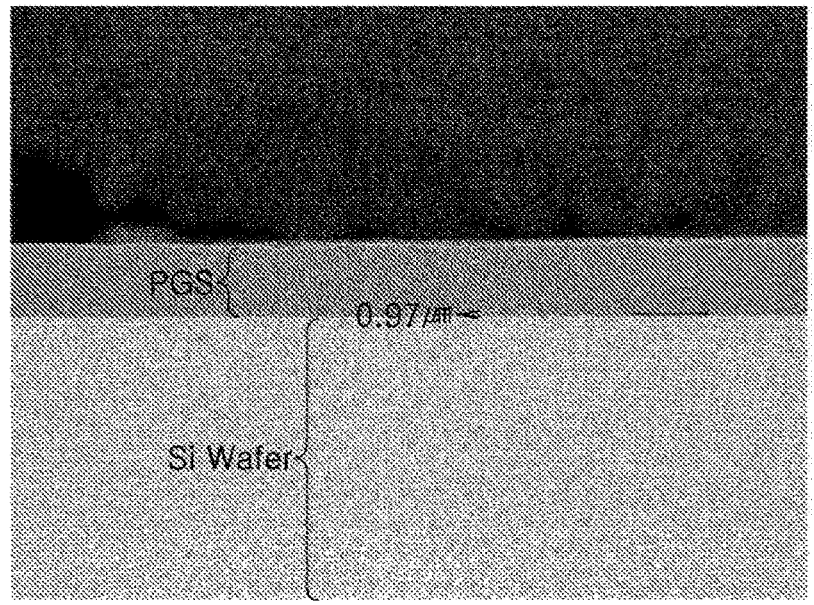
FIGS. 11A are 11B are cross-sectional diagrams illustrating a thickness of an adhesive member of a semiconductor package according to an example embodiment.

FIGS. 11A are 11B are cross-sectional diagrams illustrating a thickness of an adhesive member of a semiconductor package according to an example embodiment.

Referring to the diagrams, a semiconductor package 100A in the example embodiment may include a frame 110 having a through-hole 110H, a semiconductor chip 120 disposed in the through-hole 110H and having an active surface on which a connection pad 122 is disposed and an inactive surface opposing the active surface, a heat dissipation member 190 disposed on the inactive surface of the semiconductor chip 120, an adhesive member 180 disposed between the inactive surface of the semiconductor chip 120 and the heat dissipation member 190, an encapsulant 130 covering at least a portion of each of the frame 110, the semiconductor chip 120, and the heat dissipation member 190, an interconnect structure 140 disposed on a lower surface of the frame 110 and the active surface of the semiconductor chip 120, and including a redistribution layer 142 electrically connected to the connection pad 122, a passivation layer 150 disposed on a lower surface of the interconnect structure 140, an under-bump metal layer 160 disposed in an opening of the passivation layer 150, and an electrical connector metal 170 disposed on a lower surface of the passivation layer 150 and connected to the under-bump metal layer 160.

The frame 110 may improve stiffness of the semiconductor package 100A depending on a material of the frame 110, and may secure uniformity of a thickness of the encapsulant 130, and the like. By including the frame 110, the semiconductor package 100A in the example embodiment may be used as a portion of a package on package (POP). The frame 110 may have the through-hole 110H. In the through-hole 110H, the semiconductor chip 120 may be disposed and may be spaced apart from the frame 110 by a certain distance. Side surfaces of the semiconductor chip 120 may be surrounded by the frame 110. However, the above-described configuration is merely an example, and an example embodiment thereof is not limited thereto. In the example illustrated in the diagrams, a height of an upper surface of the frame 110 may be lower than a height of upper surfaces of the heat dissipation member 190 and the adhesive member 180, but an example embodiment thereof is not limited thereto. As an example, although not limited thereto, a height of an upper surface of the frame 110 may be higher than a height of upper surfaces of the heat dissipation member 190 and the adhesive member 180 such that the heat dissipation member 190 and the adhesive member 180 may be disposed in the through-hole 110H. If desired, the frame 110 may not be provided. Also, a metal post, and the like, may be provided for upward and downward electrical connections instead of the frame 110.

The frame 110 may have the through-hole 110H penetrating at least an insulating layer 111. The semiconductor chip 120 may be disposed in the through-hole 110H, and if desired, a passive component may also be disposed in the through-hole 110H along with the semiconductor chip 120. As illustrated in FIG. 10, a wall of the through-hole 110H may be surrounded by the semiconductor chip 120, but an example embodiment thereof is not limited thereto. The frame 110 may further include a wiring layer and a wiring via in addition to the insulating layer 111, and may function as an electrical interconnect member for upward and downward electrical connections.

As a material of the insulating layer 111, an insulating material may be used. As the insulating material, a thermosetting resin such as an epoxy resin, a thermoplastic resin such as a polyimide resin, or a resin in which the above-described resin is impregnated in a core material, such as a glass fiber (or a glass cloth or a glass fabric), together with an inorganic filler, such as prepreg, a Ajinomoto build-up film (ABF), FR-4, bismaleimide triazine (BT), and the like, may be used, for example. The frame 110 may work as a support member.

The semiconductor chip 120 may be an integrated circuit (IC) in which several hundreds to several millions or more of devices are integrated in a single chip. For example, the semiconductor chip 120 may be implemented as a processor chip, an application processor (AP), for instance, such as a central processor (e.g., a CPU), a graphics processor (e.g., a GPU), a field programmable gate array (FPGA), a digital signal processor, a cryptographic processor, a microprocessor, a microcontroller, or the like, but an example embodiment thereof is not limited thereto. The semiconductor chip 120 may also be a logic chip such as an analog-to-digital converter, an application-specific integrated circuit (ASIC), or the like, or a memory chip such as a volatile memory (e.g., a DRAM), a non-volatile memory (e.g., a ROM and a flash memory), or the like. Also, the above-mentioned components may be combined in the semiconductor chip 120.

In the semiconductor chip 120, a surface on which the connection pad 122 is disposed may be an active surface, and a surface opposing the active surface may be an inactive surface. The semiconductor chip 120 may be formed based on an active water, and in this case, silicon (Si), germanium (Ge), gallium-arsenide (GaAs), and the like, may be used as a base material of a body 121. Various circuits may be disposed in the body 121. The connection pad 122 may be configured to electrically connect the semiconductor chip 120 to the other components, and a metal material such as aluminum (Al), and the like, may be used as a material of the connection pad 122. However, an example of the material is not limited thereto. A passivation film 123 exposing the connection pad 122 may also be disposed on the body 121, and the passivation film 123 may be implemented by an oxide film, a nitride film, or the like, or may be implemented by a dual layer including an oxide film and a nitride film.

Although not illustrated in the diagram, if desired, a metal thin film may be formed on a wall of the through-hole 110H for heat dissipation and/or electromagnetic shielding. Also, if desired, a plurality of semiconductor chips performing the same function or different functions may be disposed in the through-hole 110H. Also, if desired, a passive component, such as an inductor, a capacitor, or the like, may be disposed in the through-hole 110H.

The encapsulant 130 may fill at least a portion of the through-hole 110H, and may cover at least a portion of each of the frame 110, the semiconductor chip 120, the heat dissipation member 190, and the adhesive member 180. For example, the encapsulant 130 may cover an upper surface of the frame 110, four side surfaces of the semiconductor chip 120, an upper surface and four side surfaces of the heat dissipation member 190, and four side surfaces of the adhesive member 180. In example embodiments, the encapsulant 130 may also fill at least a portion of each of a space between a wall of the through-hole 110H and a side surface of the semiconductor chip 120, a space between a wall of the through-hole 110H and a side surface of the heat dissipation member 190, and a space between a wall of the through-hole 110H and a side surface of the adhesive member 180.

As the encapsulant 130 fills the through-hole 110H, the encapsulant 130 may work as an adhesive for fixing the semiconductor chip 120 and may decrease buckling depending on a material of the encapsulant 130. The encapsulant 130 may include an insulating material, and as the insulating material, a material including an inorganic filler and an insulating resin may be used. For example, a thermosetting resin such as an epoxy resin, a thermoplastic resin such as a polyimide resin, or a resin including the above-described resin in which an reinforcement material such as an inorganic filler is included, such as an ABF, FR-4, BT, and the like, may be used. Also, a molding material such as an epoxy molding compound (EMC) may be used, and if desired, a photosensitive material such as a photoimageable encapsulant (PIE) may be used. If desired, a resin in which an insulating resin such as a thermosetting resin or a thermoplastic resin is impregnated in a glass fiber, and the like, along with an inorganic filler may be used.

The interconnect structure 140 may redistribute the connection pads 122 of the semiconductor chip 120. The several tens or several hundreds of connection pads 122 of the semiconductor chip 120 having various functions may be redistributed through the interconnect structure 140, and may be physically and/or electrically connected to an external entity through an electrical connector metal 170 in accordance with respective functions. The interconnect structure 140 may include an insulating layer 141 disposed on a lower surface of the frame 110 and the active surface of the semiconductor chip 120, the redistribution layer 142 disposed on a lower surface of the insulating layer 141, and a connection via 143 penetrating the insulating layer 141 and electrically connecting the redistribution layers 142 to the connection pads 122, respectively. Each of the insulating layer 141, the redistribution layer 142, and the connection via 143 may include a number of layers smaller than or greater than the number of layers illustrated in the diagrams.

As a material of the insulating layer 141, an insulating material may be used. As the insulating material, a photosensitive insulating material (PID) may be used. In this case, a fine pitch may be included through a photo via, and thus, a fine circuit and a high density design may be implemented such that several tens to several millions of the connection pads 122 of the semiconductor chip 120 may be effectively redistributed. If two or more than insulating layers are used, a boundary between the insulating layers may be distinct or may be indistinct.

The redistribution layer 142 may redistribute the connection pads 122 of the semiconductor chip 120 and may electrically connect the connection pads 122 to the electrical connector metal 170. As a material of the redistribution layer 142, a metal material such as copper (Cu), aluminum (Al), silver (Ag), tin (Sn), gold (Au), nickel (Ni), lead (Pb), titanium (Ti), or alloys thereof may be used. The redistribution layer 142 may perform various functions depending on a design of a respective layer. For example, the redistribution layer 182 may include a ground (GND) pattern, a power (PWR) pattern, a signal (S) pattern, and the like. The ground (GND) pattern may be the same as the power (PWR) pattern. The redistribution layer 142 may also include a via pad, an electrical connector metal pad, and the like.

The connection via 143 may electrically connect the redistribution layers 142 formed on different layers, and may electrically connect the connection pad 122 to the redistribution layer 142. The connection via 143 may be physically in contact with the connection pad 122 when the semiconductor chip 120 is a bare die. As a material of the connection via 143, a metal material such as copper (Cu), aluminum (Al), silver (Ag), tin (Sn), gold (Au), nickel (Ni), lead (Pb), titanium (Ti), or alloys thereof may be used. The connection via 143 may be entirely filled with a metal material, or a metal material may be formed along a side wall of a via hole. The connection via 143 may be a ground via, a power via, a signal via, and the like, and the ground via and may be the same as the power via. The connection via 143 may have a tapered shape, or the like.

The passivation layer 150 may protect the interconnect structure 140 from external physical and chemical damages, or the like. The passivation layer 150 may not be provided. The passivation layer 150 may have an opening for exposing at least a portion of a lowermost redistribution layer 142 of the interconnect structure 140. Several tens or several thousands of the openings may be formed in the passivation layer 150. Each of the openings may include a plurality of holes. A material of the passivation layer 150 is not limited to any particular material. For example, an insulating material may be used, and as the insulating material, a thermosetting resin such as an epoxy resin, a thermoplastic resin such as a polyimide resin, a resin including the above-described resin mixed with an inorganic filler, or a resin in which the above-described resin is impregnated in a glass fiber, and the like, along with an inorganic filler, such as an ABF, FR-4, BT, and the like, may be used. Alternatively, a solder resist (SR) may be used.

The under-bump metal 160 may improve connection reliability of the electrical connector metal 170, and may thus improve board-level reliability of the semiconductor package 100A. In example embodiments, the under-bump metal 160 may not be provided. The under-bump metal 160 may be connected to a lowermost redistribution layer 142 exposed through the opening. The under-bump metal 160 may be formed in the opening by a well-known metallization method using a metal material, a metal, but an example of the method is not limited thereto.

The electrical connector metal 170 may physically and/or electrically connect the semiconductor package 100A to an external entity. For example, the semiconductor package 100A may be mounted on a mainboard of an electronic device through the electrical connector metal 170. The electrical connector metal 170 may be formed of a metal having a lower melting point, such as a solder, and the like, for example, but an example of the material is not limited thereto. The electrical connector metal 170 may be implemented by a land, a ball, a pin, and the like. The electrical connector metal 170 may include a plurality of layers or a single layer. When the electrical connector metal 170 includes a plurality of layers, the electrical connector metals 170 may include a copper pillar and a solder, and when the electrical connector metal 170 is a single layer, the electrical connector metal 170 may include a tin-silver solder or copper, but an example embodiment thereof is not limited thereto. The number of the electrical connector metals 170, a gap between the electrical connector metals 170, an arrangement form of the electrical connector metals 170 are not limited to any particular example, and may vary depending on a design. For example, the number of the electrical connector metals 170 may be several tens to several thousands, or may be higher or lower than the above example.

At least one of the electrical connector metals 170 may be disposed in a fan-out region. The fan-out region may refer to a region beyond a region in which the semiconductor chip 120 is disposed. A fan-out package may have improved reliability as compared to a fan-in package, and a plurality of I/O terminals may be implemented, and a 3D connection may easily be implemented in a fan-out package. Also, a fan-out package may have a reduced thickness, and may be cost-competitive as compared to a ball grid array (BGA) package, a land grid array (LGA) package, and the like.

The adhesive member 180 may be disposed on the overall inactive surface of the semiconductor chip 120, and may be disposed in the through-hole 110H of the frame 110 together with the semiconductor chip 120 and the heat dissipation member 190. Alternatively, as illustrated in the diagram, the adhesive member 180 may be disposed in an upper portion of the through-hole 110H. The adhesive member 180 may have the same size as a size of the inactive surface of the semiconductor chip 120 and a size of the heat dissipation member 190 on a plane. For example, at least one side surface of the adhesive member 180 may be substantially coplanar with a side surface of the semiconductor chip 120 and a side surface of the heat dissipation member 190.

The adhesive member 180 may include an epoxy resin and a (meth)acrylate-based resin. The configuration in which the adhesive member 180 includes an epoxy resin and a (meth)acrylate-based resin may indicate that the adhesive member 180 may be formed by curing a composition including an epoxy-based compound and a (meth)acrylate-based compound. Accordingly, when the adhesive member 180 goes through a fourier-transform infrared spectroscopy (FTIR) analysis, a composition of an epoxy resin and of a (meth)acrylate-based resin may be detected.

If desired, a composition for forming the adhesive member 180 may further include a filler having high thermal conductivity. For example, the composition may include a metal, a metal oxide, and/or a ceramic filler, but an example embodiment thereof is not limited thereto. When a filler is further included in the composition for forming the adhesive member 180, thermal conductivity of the adhesive member 180 may improve, thereby improving heat dissipation properties of the semiconductor package.

By including an epoxy resin, the adhesive member 180 may have adhesive force and attaching force, and may secure reaction properties, heat resistance properties, and stiffness.

The epoxy resin may have an epoxy group on both ends thereof, and the epoxy resin may have a structure in which a plurality of repeating units formed of a hydrocarbon compound are included between the ends including an epoxy group.

The repeating units of the epoxy resin may include at least one of alicyclic hydrocarbon, saturated hydrocarbon, unsaturated hydrocarbon, and aromatic hydrocarbon in a main chain. When the epoxy resin includes alicyclic hydrocarbon, the number of aromatic hydrocarbons per repeating unit may be 1 or greater and 4 or lower, and may be 1 or greater and 2 or lower. For example, the epoxy resin may include at least one of an polyfunctional epoxy resin, a bisphenol-based epoxy resin, a novolac epoxy resin, a naphthalene epoxy resin, a trisphenol methane epoxy resin, and a glycidylamine epoxy resin. The bisphenol-based epoxy resin may include at least one of bisphenol A-based epoxy resin and the bisphenol F-based epoxy resin, and the novolac epoxy resin may include at least one of a cresol novolac epoxy and a phenol novolac epoxy, but an example embodiment thereof is not limited thereto.

By including a (meth)acrylate-based resin, the adhesive member 180 may have reaction properties, heat resistance properties, and stiffness, and may also have mobility. Accordingly, the adhesive member 180 may have adhesive force and a reduced thickness.

The (meth)acrylate-based resin may include a (meth) acrylate-based repeating unit. In the example embodiment, the term "(meth)acrylate" may include "acrylate" and/or "methacrylate." Thus, the (meth)acrylate-based resin may have a structure in which hydrogen or a methyl group is combined to each of alpha carbons in a repeating unit.

The (meth)acrylate-based resin may be formed by polymerization of a monomer represented by a chemical formula of $CH_2$=CH—COOR or $CH_2$=C($CH_3$) COOR. Thus, the (meth)acrylate-based resin may be formed by polymerization of a (meth)acrylic acid ester-based monomer.

The (meth)acrylate-based resin may be an alkyl (meth) acrylate-based resin formed by polymerization of an alkyl (meth)acrylate monomer. Also, an alkyl group of the alkyl (meth)acrylate-based resin may be a linear alkyl group or a branched alkyl group, and the alkyl group may include at least one or more functional groups from among an alkenyl group, an alkynyl group, and an alkoxy group. The alkyl group of the alkyl(meth)acrylate-based resin may include 1 or greater and 10 or lower carbon atoms, or may include 1 or greater and 3 or lower carbon atoms. For example, the (meth)acrylate-based resin may be formed by polymerization of one or more monomers selected from among methyl (meth)acrylate, ethyl(meth)acrylate, n-propyl(meth)acrylate, isopropyl(meth)acrylate, and the like.

The adhesive member 180 may include at least one or more of cross-linking between the epoxy resin and the (meth)acrylate-based resin, cross-linking between the epoxy resins, and cross-linking between the (meth)acrylate-based resins by curing of the epoxy resin and the (meth)acrylate-based resin. The cross-linking between the epoxy resins may be formed by opening of an epoxy cyclic structure between epoxy compounds. The cross-linking between the (meth) acrylate-based resins may be formed by disconnecting of a dual bond structure between the (meth)acrylate-based compounds. A degree of bonding and adhesive force of the adhesive member 180 may be varied in accordance with a composition ratio between the epoxy resin and the (meth) acrylate-based resin.

The adhesive member 180 may further include a curing agent in addition to an epoxy resin and a (meth)acrylate-based resin described above. A type of the curing agent is not limited to any particular type, and a curing agent widely used in manufacturing an adhesive member for a semiconductor product may be used. For example, the curing agent may include one or more curing agents selected from among a group consisting of an amine-based curing agent, a phenol-based curing agent, and an acid anhydride-based curing agent.

The adhesive member 180 may be formed through a plurality of curing processes for curing the epoxy resin and the (meth)acrylate-based resin. For example, the adhesive member 180 may go through a dual curing process including a primary curing process and a secondary curing process. When the epoxy resin and the (meth)acrylate-based resin are cured through two or more curing processes, a thickness of the adhesive member 180 may further decrease.

When the adhesive member 180 includes an epoxy resin and a (meth)acrylate-based resin as in the example embodiment, the adhesive member 180 may have a reduced thickness. For example, a thickness of the adhesive member 180 may be 0.1 µm or greater and 5 µm or less. Another example, a thickness of the adhesive member 180 may be 0.1 µm or greater and 3 µm or less. The above-mentioned thicknesses may be obtained by configuring viscosity of a composition for forming the adhesive member 180 before a curing process to be 200 cp or higher and 2000 cp or lower. When viscosity of a composition of the adhesive member 180 before a curing process is 600 cp or higher and 1000 cp or lower, a thickness of the adhesive member 180 may further decrease. Also, as in the example embodiment, when the adhesive member 180 includes an epoxy resin and a (meth)acrylate-based resin, there may be no degradation in adhesion force at even a high temperature, 250° C. or higher, such that the adhesive member 180 having improved reliability may be provided. Thermal conductivity of the adhesive member 180 may be 0.5 W/mK or lower. In this case, by configuring a thickness of the adhesive member 180 to be 0.1 µm or greater and 3 µm or less, thermal resistance may decrease, thereby improving heat dissipation properties of the semiconductor chip 120.

The heat dissipation member 190 may be configured to be attached to the overall inactive surface of the semiconductor chip 120 by means of the adhesive member 180, and may be disposed in the through-hole 110H of the frame 110 along with the semiconductor chip 120 and the adhesive member 180. Alternatively, as illustrated in the diagram, the heat dissipation member 190 may be disposed in an upper portion of the through-hole 110H. The heat dissipation member 190 may have a size substantially the same as a size of the inactive surface of the semiconductor chip 120 on a plane. For example, at least one surface of the heat dissipation member 190 may be substantially coplanar with a side surface of the semiconductor chip 120. The heat dissipation member 190 may be provided in a form of a sheet, and may be adhered to the inactive surface of the semiconductor chip 120 by the adhesive member 180.

The heat dissipation member 190 may include a graphite-based material having thermal conductivity higher than thermal conductivity of silicon (Si) and having a thermal expansion rate similar to a thermal expansion rate of silicon (Si), such as pyrolytic graphite. A pyrolytic graphite may include a thermal pyrolytic graphite (TPG), a highly oriented pyrolytic graphite (HOPG), a compression-annealed pyrolytic graphite (CAPG), and the like. The heat dissipation member 190 may have a form of a pyrolytic graphite sheet (PGS). The PGS may include 90 wt % or higher of pyrolytic graphite. As a first additive, less than 5 wt % of at least one of zirconium (Zr), chromium (Cr), and boron (B) may be included, and as a second additive, less than 5 wt % of at least one of a carbon nanotube (CNT), boron nitride, and a combination thereof may be included.

The heat dissipation member 190 may have a thickness less than a thickness of the semiconductor chip 120. For example, a thickness of the heat dissipation member 190 may be less than 50% of a sum of thicknesses of the semiconductor chip 120 and the heat dissipation member 190. For example, a thickness of the semiconductor chip 120 may be within a range of 50 µm to 180 µm, and a thickness of the heat dissipation member 190 may be 20 µm or greater, or within a range of 20 µm to 100 µm. As the heat dissipation member 190 includes pyrolytic graphite among carbon-based materials, the heat dissipation member 190 may have a thickness of the above-mentioned range. For example, among other carbon-based materials, graphene may have an excessively thin thickness, and as for silicon carbide, it may be difficult to reduce a thickness of silicon carbide. As compared to the above-mentioned materials, it may be easy to adjust a thickness of pyrolytic graphite and to process pyrolytic graphite.

Thermal conductivity of the heat dissipation member 190 may be higher than thermal conductivity of silicon (Si). For example, the heat dissipation member 190 may have thermal conductivity exceeding 150 W/mK approximately, thermal conductivity of silicon (Si), in a horizontal direction. For example, the heat dissipation member 190 may have thermal conductivity of 500 to 2000 W/mK. Accordingly, the heat dissipation member 190 may have thermal conductivity higher than those of copper and aluminum.

In the description below, a method of forming the adhesive member 180 and the heat dissipation member 190 on the semiconductor chip 120 will be described. A curing process may be implemented by the above-described dual curing process.

An inactive surface of the semiconductor chip 120 may be coated with a composition for forming the adhesive member 180 which includes an epoxy resin and a (meth)acrylate-based resin.

As a method of coating a composition for forming the adhesive member 180, a dispensing method, a spraying method, a slot coating method, and a spin coating method may be used, but an example of the method is not limited thereto. When the adhesive member 180 is coated using a spin coating method, a thin and uniform coating layer may be formed. However, the coating method is not limited thereto, and one of well-known coating methods may be used.

After coating the composition, a primary curing process may be performed. As the primary curing process, a UV curing method or a thermal curing method may be used. When the primary curing process is implemented by a thermal curing method, a thickness may be reduced, and a process may be simplified. A temperature of the thermal curing process may be 150° C. or lower to protect the semiconductor chip 120, an object to which the heat dissipation member is attached.

After the primary curing process, the heat dissipation member 190 may be attached to the adhesive member 180. To improve adhesive force between the adhesive member 180 and the heat dissipation member 190, pressure may be applied to a contact surface. For example, less than 10 Mpa of pressure may be applied on the contact surface in a vertical direction. When the pressuring process is performed in a vacuum vessel, bubbles or gas created on the contact surface may be removed.

While or after applying pressure, a secondary curing process may be performed. The secondary curing process may be performed as a thermal curing process, and as in the primary curing process, a temperature of the thermal curing process may be 150° C. or lower to protect the semiconductor chip 120, an object to which the heat dissipation member is attached.

The process for forming the adhesive member 180 and the heat dissipation member 190 may be performed before or after a dicing process. Accordingly, the adhesive member 180 and the heat dissipation member 190 may be formed on a wafer or a die, Thus, before dicing a wafer, the adhesive member 180 may be formed on the wafer, and the heat dissipation member 190 may be attached by means of the adhesive member 180, and a dicing process may be performed in a state in which the wafer, the adhesive member 180, and the heat dissipation member 190 are integrated with one another. Alternatively, after the dicing the wafer, the adhesive member 180 may be formed on each of dies, and the heat dissipation member 190 may be attached by means of the adhesive members 180.

In the description below, an example embodiment of the present disclosure will be described in greater detail. It should be noted that the exemplary embodiments are provided to describe the present disclosure in greater detail, and to not limit the present disclosure.

Embodiment 1

Compositions for forming the adhesive member 180 were obtained by mixing a novolac epoxy resin and an alkyl (meth)acrylate-based resin having three or less carbon atoms in mole ratio of 1:8 to 10. Accordingly, the number of moles of an epoxy resin included in the adhesive member was less than the number of moles of a (meth)acrylate-based resin.

The inactive surface of the semiconductor chip 120 having a thickness of 125 μm was coated with a solution of the adhesive member 180 by a spin coating method, and a primary thermal curing process was performed for 1 minute at 150° C. After the primary thermal curing process, the heat dissipation member 190 having a thickness of 25 μm was attached to the adhesive member 180, and a secondary thermal curing process was performed for 30 minutes at 150° C. A pyrolytic graphite sheet (PGS) was used as the heat dissipation member 190.

Embodiment 2

A composition for forming the adhesive member 180 was obtained by mixing a bisphenol F-based epoxy resin, a bisphenol A-based epoxy resin, and an alkyl (meth)acrylate-based resin having three or less carbon atoms in mole ratio of 1:0.7:0.8. Accordingly, the number of moles of the epoxy resin included in the adhesive member was greater than the number of moles of a (meth)acrylate-based resin, and the number of moles of the bisphenol A-based epoxy resin is less than the number of moles of the bisphenol F-based epoxy resin.

Other conditions were the same as in Embodiment 1.

Embodiment 3

A composition for forming the adhesive member 180 was obtained by mixing a bisphenol F-based epoxy resin, a bisphenol A-based epoxy resin, and an alkyl (meth)acrylate-based resin having three or less carbon atoms in mole ratio of 1:1:0.8. Accordingly, the number of moles of the epoxy resin included in the adhesive member was greater than the number of moles of a (meth)acrylate-based resin, and the number of moles of the bisphenol A-based epoxy resin was the same as the number of moles of the bisphenol F-based epoxy resin.

Other conditions were the same as in Embodiment 1.

Comparative Example 1

Thermal conductivity of the semiconductor chip 120 having a thickness of 150 μm was measured.

Comparative Example 2

An epoxy resin was used as a solution of the adhesive member 180, the semiconductor chip 120 was coated with the solution by a spin coating method, and a UV curing process was performed as a primary curing process under conditions of 365 nm and 500 mj/cm$^2$. After the primary UV curing process, the heat dissipation member 190 was attached to the adhesive member 180, and a thermal curing process was performed as a primary curing process for 30 minutes at 100° C.

Other conditions were the same as in Embodiment 1.

In comparative example 1, thermal conductivity of the semiconductor chip 120 having a thickness of 150 μm, which does not include the adhesive member 180 and the heat dissipation member 190, was measured as 150 W/mK.

In comparative example 2, viscosity of the composition for forming the adhesive member was relatively high, 10,000 cp or higher and 40,000 cp or lower, and when the temperature increased to 200° C. or higher, the adhesion was separated.

However, in embodiments 1 to 3, a thickness of the adhesive member 180 was measured as 0.1 to 3 μm, viscosity of the composition for forming the adhesive member 180 was measured as 200 cp or higher and 2000 cp or lower, and there was no degradation in adhesive force even at a relatively higher temperature of 250° C. or higher.

Figure 11B:
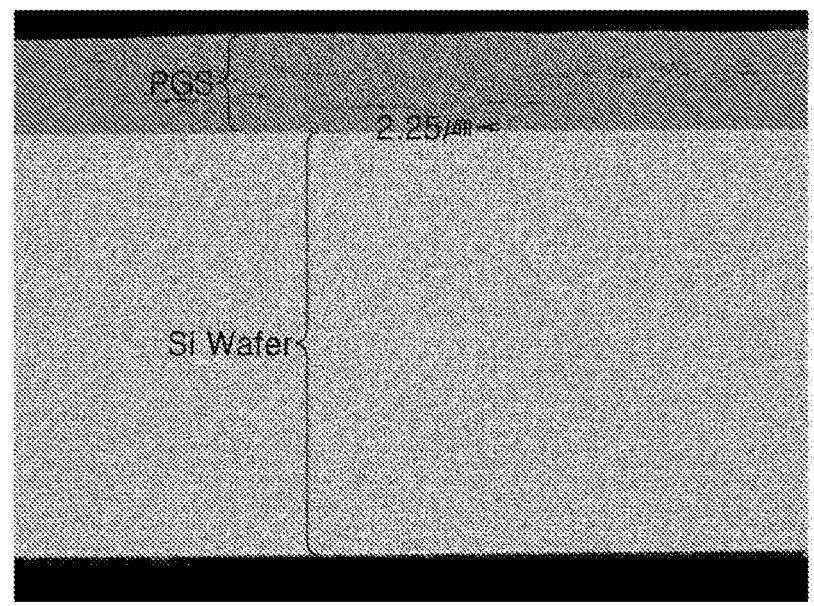

For example, referring to FIGS. 11A and 11B, the result of embodiment 1 was measured using a scanning electron microscope (SEM), and a thickness of the adhesive member 180 after the primary curing process was 0.97 μm, and a thickness of the adhesive member 180 after the secondary curing process was 2.25 μm.

In embodiments 1 to 3, thermal conductivity of the semiconductor chip 120 including the adhesive member 180 and the heat dissipation member 190 was measured by a laser flash method, and the thermal conductivity was 360 W/mK to 380 W/mK. Thus, under the thickness condition the same as the thickness condition (150 μm) of comparative example 1, thermal conductivity of the semiconductor chip 120 of the embodiments increased by 2.4 times than 150 W/mK, the thermal conductivity of the semiconductor chip 120 which did not include adhesive member 180 and the heat dissipation member 190.

Thus, as compared to comparative examples 1 and 2, in embodiments 1 to 3, the adhesive member 180 having a reduced thickness may be formed using a composition having low viscosity, thereby reducing a thickness of the semiconductor package. Also, the adhesive member 180 with no degradation in adhesive force may be formed at a relatively high temperature. Thus, the semiconductor package having a reduced size and including the semiconductor chip having improved heat dissipation properties may be provided. Also, the semiconductor package including the adhesive member which may have improved interfacial adhesion reliability at a relatively high temperature may be provided.

Figure 12:
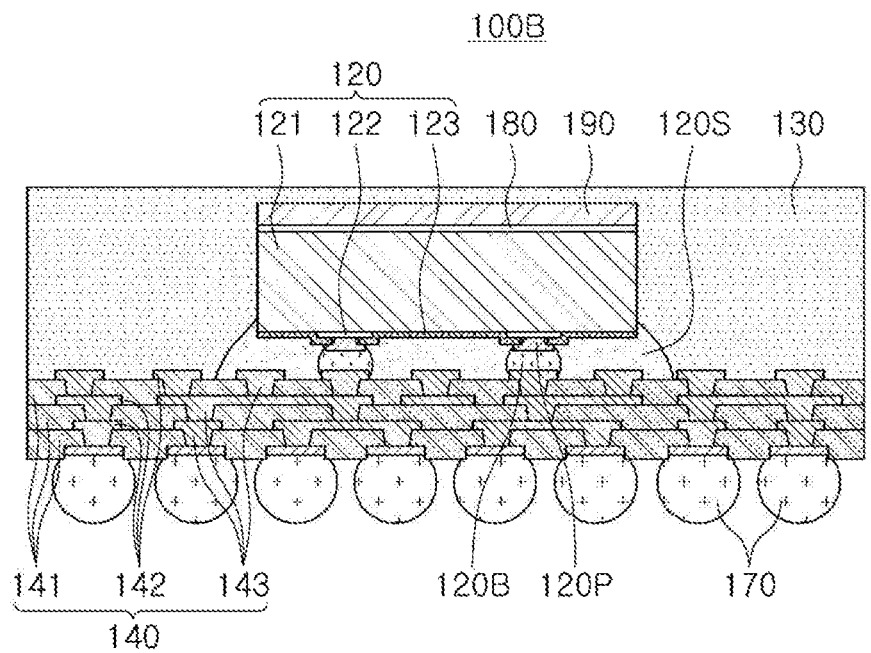
FIG. 12 is a cross-sectional diagram illustrating another example of a semiconductor package.

FIG. 12 is a cross-sectional diagram illustrating another example of a semiconductor package.

Referring to the diagram, in a semiconductor package 100B in the example embodiment, a interconnect structure 140 may have a form of an organic interposer. A semiconductor chip 120 may be disposed on the interconnect structure 140 using a surface mount technology (SMT). For example, a metal bump 120P formed by plating a metal such as copper (Cu) may be disposed on a connection pad 122 of the semiconductor chip 120, and the metal bump 120P may be connected to a pad pattern protruding from a surface of a redistribution layer 142 of the interconnect structure 140 through a second electrical connector metal 120B such as a solder paste, and the like. Accordingly, the semiconductor chip 120 may be physically isolated from the interconnect structure 140. Also, a space between the semiconductor chip 120 and the interconnect structure 140 may be filled with an underfill resin 120S such that a first electrical connector metal 120B, and the like, may be embedded in the underfill resin, and the semiconductor chip 120 may be firmly fixed. In one example, the frame 110 described with reference to FIG. 9 may be omitted.

The descriptions of the other elements are the same as in the aforementioned example embodiment of the semiconductor package 100A, and thus, the detailed descriptions thereof will not be provided.

Figure 13:
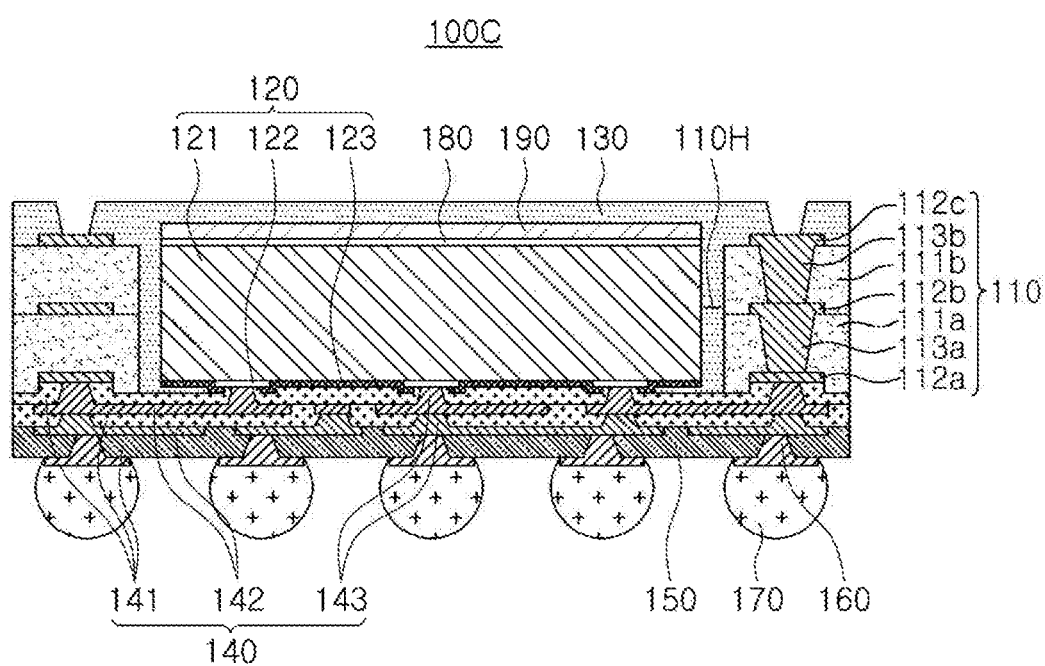
FIG. 13 is a cross-sectional diagram illustrating another example of a semiconductor package.

FIG. 13 is a cross-sectional diagram illustrating another example of a semiconductor package.

Referring to the diagram, in a first semiconductor package 100C in the example embodiment, the frame 110 may have a different form, differently from the semiconductor package 100A described in the aforementioned example embodiment.

The frame 110 may include a first insulating layer 111a, a first wiring layer 112a in contact with an interconnect structure 140 and buried in the first insulating layer 111a, a second wiring layer 112b disposed on an opposite surface of the surface of the first insulating layer 111a in which the first wiring layer 112a is buried, a second insulating layer 111b disposed on an opposite surface of the surface of the first insulating layer 111a in which the first wiring layer 112a is buried and covering at least a portion of the second wiring layer 112b, and a third wiring layer 112c disposed on an opposite surface of the surface of the second insulating layer 111b in which the second wiring layer 112b is buried. The first and second wiring layers 112a and 112b and the second and third wiring layers 112b and 112c may be electrically connected through first and second wiring vias 113a and 113b penetrating the first and second insulating layers 111a and 111b, respectively. The first to third wiring layers 112a, 112b, and 112c may be electrically connected to a connection pad 122 through a redistribution layer 142 of the interconnect structure 140 and a connection via 143 in accordance with respective functions.

A material of the insulating layers 111a and 111b is not limited to any particular material. For example, an insulating material may be used. As the insulating material, a thermosetting resin such as an epoxy resin, a thermoplastic resin such as a polyimide resin, or a resin including the above-described resin mixed with an inorganic filler, such as Ajinomoto build-up film (ABF), or the like, may be used. Alternatively, a material in which the above-described resin is impregnated in a glass fiber, and the like, along with an inorganic filler, such as pregreg, or the like, may be used.

The wiring layers 112a, 112b, and 112c may provide upward and downward electrical connection paths along with wiring vias 113a and 113b, and may redistribute the connection pads 122. As a material of the wiring layers 112a, 112b, and 112c, a metal material such as copper (Cu), aluminum (Al), silver (Ag), tin (Sn), gold (Au), nickel (Ni), lead (Pb), titanium (Ti), or alloys thereof may be used. The wiring layers 112a, 112b, and 112c may perform various functions depending on designs of respective layers. For example, the wiring layers 112a, 112b, and 112c may include a ground (GrouND: GND) pattern, a power (PoWeR: PWR) pattern, a signal (Signal: S) pattern, and the like. The signal (S) pattern may include various signals other than a ground (GND) pattern, a power (PWR) pattern, and the like, such as a data signal. The ground (GND) pattern may be the same as the power (PWR) pattern. The wiring layers 112a, 112b, and 112c may include a various types of via pads, and the like. The wiring layers 112a, 112b, and 112c may be formed of a well-known plating process, and each may include a seed layer and a plating layer.

A thickness of each of the wiring layers 112a, 112b, and 112c may be greater than a thickness of each of the redistribution layers 142. For example, as the frame 110 may have a thickness greater than a thickness of the semiconductor chip 120, and pregreg, or the like, may be selected as a material of the insulating layers 111a and 111b to maintain stiffness, each of the wiring layers 112a, 112b, and 112c may have a relatively great thickness. Also, as the interconnect structure 140 is designed to include a fine circuit and to have high density, and a photosensitive insulating material (PID) may thus be selected as a material of the insulating layer 141, the redistribution layer 142 formed in the interconnect structure 140 may also have a relatively reduced thickness.

The first wiring layer 112a may be recessed into the first insulating layer 111a. When a difference is formed between a surface of the first insulating layer 111a in contact with the interconnect structure 140 and a surface of the first wiring layer 112a in contact with the interconnect structure 140 as the first wiring layer 112a is recessed into the first insulating layer 111a, contamination of the first wiring layer 112a by bleeding of a forming material when the semiconductor chip 120 and the frame 110 are encapsulated using an encapsulant 130 may be prevented.

The wiring vias 113a and 113b may electrically connect the wiring layers 112a, 112b, and 112c formed on different layers, and may accordingly form electrical paths in the frame 110. As a material of the wiring vias 113a and 113b, a metal material such as copper (Cu), aluminum (Al), silver (Ag), tin (Sn), gold (Au), nickel (Ni), lead (Pb), titanium (Ti), or alloys thereof may be used. The wiring vias 113a and 113b may include a ground via, a power via, a signal via, and the like, and the power via may be the same as the ground via. The wiring vias 113a and 113b may be a field type via filled with a metal material, or may be a conformal type via in which a metal material is formed along a wall of the via hole. Each of the wiring vias 113a and 113b may have a tapered shape. The wiring vias 113a and 113b may be formed by a plating process, and each may include a seed layer and a conductive layer.

A portion of pads of the first wiring layer 112a may work as stoppers when a hole for the first wiring via 113a is formed, and accordingly, it may be preferable for the first wiring via 113a to have a tapered shape in which a width of an upper surface is greater than a width of a lower surface in terms of process. In this case, the first wiring via 113a may be integrated with a pad pattern of the second wiring layer 112b. Also, a portion of pads of the second wiring layer 112b may work as stoppers when a hole for the second wiring via 113b is formed, and accordingly, it may be preferable for the second wiring via 113b to have a tapered shape in which a width of an upper surface is greater than a width of a lower surface in terms of process. In this case, the second wiring via 113b may be integrated with a pad pattern of the third wiring layer 112c.

The descriptions of the other elements are the same as in the aforementioned example embodiment of the semiconductor package 100A, and thus, the detailed descriptions thereof will not be provided.

Figure 14:
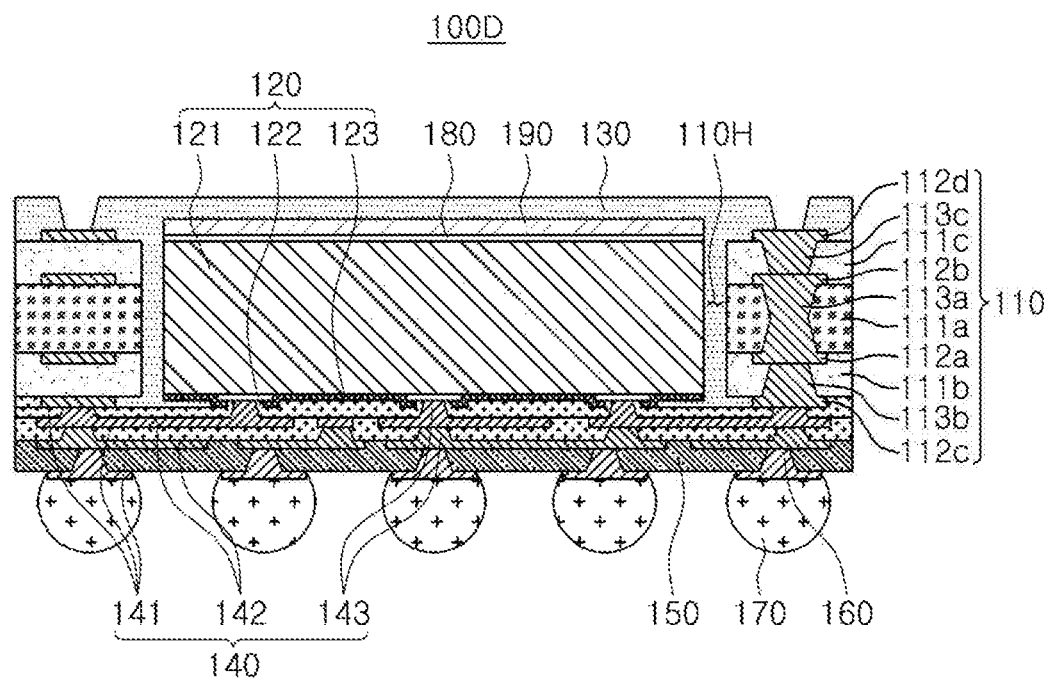
FIG. 14 is a cross-sectional diagram illustrating another example of a semiconductor package.

FIG. 14 is a cross-sectional diagram illustrating another example of a semiconductor package.

Referring to the diagram, in a first semiconductor package 100D, the frame 110 may have a different from, differently from the semiconductor package 100C described in the aforementioned example embodiment. For example, the frame 110 may include a first insulating layer 111a, a first wiring layer 112a and a second wiring layer 112b disposed on both surfaces of the first insulating layer 111a, respectively, a second insulating layer 111b and a third insulating layer 111c disposed on both surfaces of the first insulating layer 111a, respectively, and covering the first and second wiring layers 112a and 112b, respectively, a third wiring layer 112c disposed on an opposite surface of the surface of the second insulating layer 111b in which the first wiring layer 112a is buried, a fourth wiring layer 112d disposed on an opposite surface of the surface of the third insulating layer 111c in which the second wiring layer 112b is buried, a first wiring via 113a penetrating the first insulating layer 111a and electrically connecting the first and second wiring layers 112a and 112b, a second wiring via 113b penetrating the second insulating layer 111b and electrically connecting the first and third wiring layers 112a and 113c, and a third wiring via 113c penetrating the third insulating layer 111c and electrically connecting the second and fourth wiring layers 112b and 112d. As the frame 110 includes a greater number of wiring layers 112a, 112b, 112c, and 112d than in the aforementioned example embodiment, a interconnect structure 140 may be further simplified.

A thickness of the first insulating layer 111a may be greater than a thickness of each of the second insulating layer 111b and the third insulating layer 111c. The first insulating layer 111a may have a relatively great thickness to maintain stiffness, and the second insulating layer 111b and the third insulating layer 111c may be provided to form a greater number of the wiring layers 112c and 112d. Similarly, the first wiring via 113a penetrating the first insulating layer 111a may have a height and an average diameter greater than a height and an average diameter of each of the second and third wiring vias 113b and 113c penetrating second and third insulating layers 111b and 111c. Also, as the first wiring via 113a has an hourglass shape or a cylindrical shape, whereas each of the second and third wiring vias 113b and 113c may have a tapered shape, tapered in opposite directions. A thickness of each of the wiring layers 112a, 112b, 112c, and 112d may be greater than a thickness of each of the redistribution layers 142.

The descriptions of the other elements are the same as in the aforementioned example embodiments of the semiconductor packages 100A and 100C, and thus, the detailed descriptions thereof will not be provided.

Figure 15:
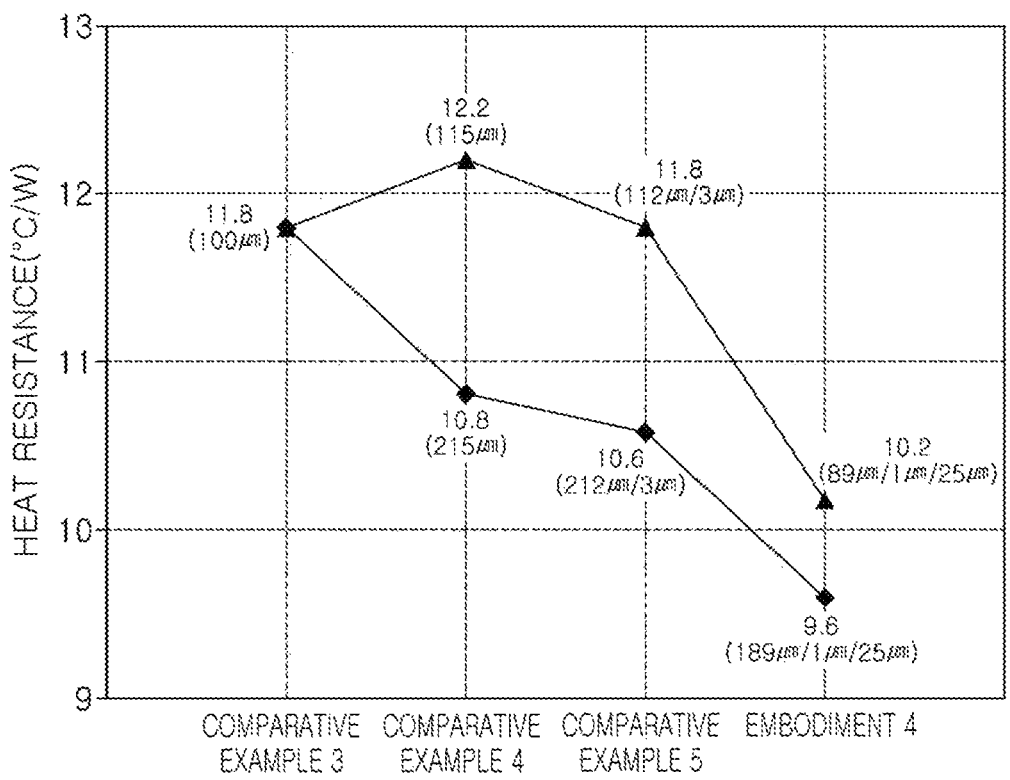
FIG. 15 is a graph illustrating a result of simulation on a heat dissipation effect of a semiconductor package according to an example embodiment.

FIG. 15 is a graph illustrating a result of simulation on a heat dissipation effect of a semiconductor package according to an example embodiment.

FIG. 15 illustrates a result of simulation of thermal resistance of comparative examples 3 to 5 and embodiment 4 in which the packages had different structures. Comparative example 3 is a sample in which a lower package includes a semiconductor chip having a thickness of 100 μm in a laser drill process (LPD)-PoP structure. Comparative example 4 is a sample in which the heat dissipation member 190 and the adhesive member 180 were not provided in the semiconductor package 100A described in the aforementioned example embodiment, and the semiconductor chip 120 having a thickness of 115 μm and the semiconductor chip 120 having a thickness of 215 μm were included in the semiconductor package 100A. Comparative example 5 is a sample in which a graphite layer having a thickness of 3 μm formed on the inactive surface of the semiconductor chip 120 by a sputtering process was included, and the semiconductor chip 120 having a thickness of 112 μm and the semiconductor chip 120 having a thickness of 215 μm were included in the sample of comparative example 4. Embodiment 4 is a sample in which the semiconductor chip 120, the adhesive member 180, and the heat dissipation member 190 having thicknesses of 89 μm, 1 μm, and 25 μm, respectively, and having thicknesses of 189 μm, 1 μm, and 25 μm, respectively, were used in the semiconductor package 100A described in the aforementioned example embodiment. As the adhesive member 180, the adhesive member 180 having low viscosity and an extremely thin thickness formed by curing an epoxy resin and a (meth)acrylate-based resin described in the aforementioned example embodiment was used, and as the heat dissipation member 190, a pyrolytic graphite sheet (PGS) was used.

According to the result of the simulation, with reference to comparative example 3, in embodiment 4, thermal resistances decreased by approximately 18.6% and 13.6%, respectively, with reference to die thicknesses of the semiconductor chips 120 having thicknesses of 115 μm and 215 μm, respectively, such that an effect of decreasing heat resistance was excellent as compared to comparative examples 4 and 5. As for comparative example 5 and embodiment 4, in comparative example 5 which simply included a graphite layer formed by a sputtering process, there was a limitation in increasing a thickness in terms of process and costs such that thermal resistance was relatively high, whereas in embodiment 4, by using a pyrolytic graphite sheet, the heat dissipation member 190 had a relatively great thickness as compared to comparative example 5, and accordingly, a heat dissipation effect was excellent.

According to the aforementioned example embodiments, the semiconductor package which may have a reduced thickness and may include a semiconductor chip having improved heat dissipation properties may be provided.

Also, the semiconductor package including the adhesive member which may have improved interfacial adhesion reliability at a relatively high temperature may be provided.

In the example embodiments, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. A semiconductor package, comprising:
    a frame having a through-hole and including a lower surface and an upper surface opposing the lower surface;
    a semiconductor chip disposed in the through-hole and having an active surface on which a connection pad is disposed and an inactive surface opposing the active surface;
    a heat dissipation member disposed on the inactive surface of the semiconductor chip and including a graphite material;
    an adhesive member disposed between the semiconductor chip and the heat dissipation member;
    an encapsulant covering a portion of each of the semiconductor chip and the heat dissipation member, and disposed in a portion of the through-hole: and
    an interconnect structure disposed on the active surface of the semiconductor chip and the lower surface of the frame, and including a redistribution layer connected to the connection pad,
    wherein the encapsulant covers a portion of a side surface of the adhesive member,
    wherein the heat dissipation member includes a lower surface bonded to the adhesive member and an upper surface opposing the lower surface,
    wherein the upper surface of the heat dissipation member is disposed on a level above the upper surface of the frame, with respect to a direction from the interconnect structure to the semiconductor chip,
    wherein a thickness of the heat dissipation member is less than a thickness of the semiconductor chip and the thickness of the heat dissipation member is greater than a thickness of the adhesive member.

2. The semiconductor package of claim 1, wherein the heat dissipation member includes a pyrolytic graphite sheet.

3. The semiconductor package of claim 1, wherein the adhesive member includes an epoxy resin and an (meth)acrylate-based resin.

4. The semiconductor package of claim 3, wherein the adhesive member includes one or more selected from the group consisting of cross-linking between the epoxy resin and the (meth)acrylate-based resin, cross-linking between the epoxy resins, and cross-linking between the (meth)acrylate-based resins.

5. The semiconductor package of claim 3, wherein the epoxy resin includes one or more selected from the group consisting of a polyfunctional epoxy resin, a bisphenol-based epoxy resin, a novolac epoxy resin, a naphthalene epoxy resin, a trisphenol methane epoxy resin, and a glycidylamine epoxy resin.

6. The semiconductor package of claim 3,
    wherein the (meth)acrylate-based resin includes an alkyl (meth)acrylate-based resin,
    wherein an alkyl group of the alkyl (meth)acrylate-based resin is a linear alkyl group or a branched alkyl group, and
    wherein the alkyl group includes one or more functional groups selected from the group consisting of an alkenyl group, an alkynyl group, and an alkoxy group.

7. The semiconductor package of claim 3, wherein the (meth)acrylate-based resin includes an alkyl (meth)acrylate-based resin having 3 or less carbon atoms.

8. The semiconductor package of claim 3, wherein the epoxy resin includes a bisphenol A-based epoxy resin and a bisphenol F-based epoxy resin.

9. The semiconductor package of claim 8,
    wherein a number of moles of the epoxy resin included in the adhesive member is greater than a number of moles of the (meth)acrylate-based resin, and
    wherein a number of moles of the bisphenol A-based epoxy resin included in the epoxy resin is less than or the same as a number of moles of the bisphenol F-based epoxy resin.

10. The semiconductor package of claim 3,
    wherein the epoxy resin includes a novolac epoxy resin, and
    wherein the (meth)acrylate-based resin includes an alkyl (meth)acrylate-based resin having 3 or less carbon atoms.

11. The semiconductor package of claim 10, wherein a number of moles of the epoxy resin included in the adhesive member is less than a number of moles of the (meth)acrylate-based resin.

12. The semiconductor package of claim 1, wherein the adhesive member has a thickness of 0.1 µm or greater and 3 µm or less.

13. The semiconductor package of claim 1, wherein a side surface of the semiconductor chip, the side surface of the adhesive member, and a side surface of the heat dissipation member are coplanar with one another.

14. The semiconductor package of claim 13, wherein another side surface of the semiconductor chip, another side surface of the adhesive member, and another side surface of the heat dissipation member are coplanar with one another.

15. The semiconductor package of claim 13, wherein the upper surface of the heat dissipation member is covered by the encapsulant.

16. The semiconductor package of claim 1,
    wherein the frame further includes a plurality of wiring layers connected to the connection pad, and
    wherein the plurality of wiring layers are connected to the connection pad.

17. The semiconductor package of claim 1, wherein thermal conductivity of the adhesive member is 0.5 W/mK or less.

18. The semiconductor package of claim 1, wherein the adhesive member includes a metal oxide or a ceramic filler.

* * * * *